United States Patent [19]

Chu et al.

[11] Patent Number: 5,578,551
[45] Date of Patent: Nov. 26, 1996

[54] METHOD FOR SYNTHESIS OF HIGH-TEMPERATURE HG-BA-CA-CU-O (HBCCO) SUPERCONDUCTORS

[75] Inventors: Ching-Wu Chu; Ruling Meng; Y. Q. Wang, all of Houston, Tex.

[73] Assignee: University of Houston, Houston, Tex.

[21] Appl. No.: 98,688

[22] Filed: Jul. 28, 1993

[51] Int. Cl.$^6$ ..................... C01F 11/02
[52] U.S. Cl. ............... 505/125; 505/126; 505/776; 505/785; 505/725; 252/518; 252/521; 423/593; 423/604; 423/635
[58] Field of Search .................. 505/110, 125, 505/126, 785, 776, 725; 427/62, 63; 423/593, 604, 635; 252/518, 521

[56] References Cited

U.S. PATENT DOCUMENTS

| 5,082,825 | 1/1992 | Hermann et al. | 505/1 |
| 5,177,055 | 1/1993 | Kinsman et al. | 505/425 |

OTHER PUBLICATIONS

Adachi et al, Appl. Phys. lett. 63(26) Dec. 1993, pp. 3628–3629.
Zeng et al, Appl. Phys. lett. 56(16) Apr. 1990, pp. 1573–1575.
"Superconductivity above 130 K in the Hg–Ba–Ca–Cu–O System," by A. Schilling, M. Cantoni, J. D. Guo & H. R. Ott, *Nature*, vol. 363, pp. 56–58 (May 6, 1993).
"Superconductivity at 94 K in $HgBa_2CuO_{4+\delta}$", by S. N. Putilin, E. V. Antipov, O. Chmaissem and M. Marezio, *Nature*, vo. 362, pp. 226–228 (Mar. 18, 1993).
"Structure and superconductivity of $HgBa_2CuO_{4+\delta}$," by J. L. Wagner, P. G. Radaelli, D. G. Hinks, J. D. Jorgensen, J. F. Mitchell, B. Dabrowski, G. S. Knapp and M. A. Beno, *Physica*, C210 (1993) pp. 447–454.
"Model for the reversible magnetization of high–k tyle–II superconductors: Application to high-$T_c$ superconductors," by Zhidong Hao and John R. Clem, *Physical Review B*, vol. 43, No. 4, pp. 2844–2852 (Feb. 1, 1991).
"Crystal Structures of High–Temperature Superconductors," by Robert M. Hazen, *Properties of High Temperature Superconductors, II*, edited by D. M. Ginsberg (World Scientific, Singapore, 1990).
"New Complex Copper Oxides: $HbBa_2RCu_2O_7$ (R=La, Nd, Eu, Gd, Dy, Y)," by S. N. Putilin, I. Bryntse, E. V. Antipov, *Mat. Res. Bull.*, vol. 26, pp. 1299–1307 (1991).

*Primary Examiner*—Roy V. King
*Attorney, Agent, or Firm*—Fulbright & Jaworski LLP

[57] ABSTRACT

The present invention is a controlled vapor/solid reaction process for the synthesis of samples of bulk compositions with a structure defined by the homologous series $HgBa_2Ca_{n-1}Cu_nO_{2n+2+\delta}$ [Hg-12(n–1)n] with n=2, 3, ... with up to 75 to 90% Hg-1212 and 65 to 75% Hg-1223 by volume, which display sharp superconducting transitions up to 135 K.

33 Claims, 10 Drawing Sheets

1

METHOD FOR SYNTHESIS OF HIGH-TEMPERATURE HG-BA-CA-CU-O (HBCCO) SUPERCONDUCTORS

U.S. GOVERNMENT RIGHTS

This invention was partially supported by grants from the U.S. Government. The Government has certain rights in this invention.

BACKGROUND OF THE INVENTION

1. Field of the Invention.

This invention relates to a composition and method for synthesizing high temperature superconductors in bulk and thin film.

2. Discussion of the Related Art.

Superconductivity above 130 K has recently been observed in the multiphased Hg-Ba-Ca-Cu-O (HBCCO) compound system. This multiphased HBCCO was found to consist of the homologous series $HgBa_2Ca_{n-1}Cu_nO_{2n+2+\delta}$ [Hg-12(n-1)n] with n=1, 2, 3, . . . and superstructures of well-defined stacking-sequences of members of Hg-12(n-1)n. Similar to the $TlBa_2CA_{n-1}Cu_nO_{2n+3+\delta}$[Tl-12(n-1)n] structure, Hg-12(n-1)n has a general layered structure with repeated stacking of the rock-salt type layers of (BaO)(HgO$\delta$)(BaO) and the perovskite-type layers of $(CuO_2)Ca(CuO_2)$ . . . Unlike Tl-12(n-1)n, which contains the trivalent Tl and therefore the rock-salt type layers of (BaO)(TlO)(BaO), Hg-12(n-1)n has the divalent Hg and thus the oxygen-deficient rock-salt type layers of (BaO)(HgO$_\delta$)(BaO).

Soon after the reports of superconductivity above 130 K in the multiphase Hg-BaCa-Cu-O (HBCCO) samples, efforts were made to identify the compound phase or phases responsible for superconductivity at such high temperatures. Very recently, $HgBa_2CaCu_2O_{6+\delta}$(Hg-1212) and $HgBa_2Ca_2Cu_3O_{8+\delta}$ (Hg-1223) were successfully synthesized and characterized. Hg-1212, which has two $CuO_2$-layers per unit cell, displays a tetragonal structure with lattice parameters a=3.862(1) Å and c=12.707(5)Å, and a magnetically-determined sharp superconducting transition at ~112 K before oxygenation and up to ~120 K after oxygenation.

On the other hand, Hg-1223, which possesses three $CuO_2$-layers per unit cell, exhibits an orthorhombic structure with lattice parameters a=5.451(2) Å, b=5.432(2) Å, and c=15.826(7) Å, and a magnetically-determined sharp superconducting transition at ~120 before oxygenation and ~135 after oxygenation. The resistivity of Hg-1223 becomes zero at 134 K which is the highest reproducible resistively determined transition-temperature ($T_c$) ever observed. The irreversibility line $H_r(T_r)$ of Hg-1212 was carefully examined in the art and was found to follow the power law $H_r \propto (1-T_r/T_{co})^\alpha$ with $\alpha$~5/2 and $T_{co}$ being the onset superconducting transition-temperature in the absence of a magnetic field.

A similar power law was also observed in the art to apply to $YBa_2Cu_3O_7$ (Y-123) and the double $BiO_2$_and $TlO_2$_layer high-temperature superconductors (HTS's) $Bi_2Sr_2Ca_{n-1}Cu_nO_{2n+4}$ and $Tl_2Ba_2Ca_{n-1}Cu_nO_{2n+4}$ where v=2 or 3, but with n~3/2 and ~11/2, respectively. This suggests that the critical current density ($J_c$) for Hg-1212 should lie between those of Y-123 and the Bi/Tl-based HTS's at the same reduced temperature, due to the stronger coupling between $CuO_2$-blocks.

2

Given the higher $T_c$ to comparison with that of Y-123, Hg-1212 may be a good candidate for large total current (I) or large $J_c$ applications provided that the compound can be made into practical forms and the compound stability is improved. One such practical form is important for electronic applications is thin film.

The standard solid-state reaction technique has been employed to prepare the superconducting phases of the HBCCO system. Oxides and/or carbonates of the cations have been used successfully as the starting ingredients. Because of the low decomposition temperature (~500° C.) of HgO with respect to the high reaction-temperature (~800° C.), and the high vapor-pressure and corrosive nature of Hg at the reaction temperature pose a serious challenge to the preparation of Hg-1212, Hg-1223 or other homologous members. The absence of Ca in $HgBa_2CuO_{4+\delta}$ (Hg-1201) makes the preparation of Hg-1201 slightly easier. Other problems include the easy formation of the insulating layered compound of $CaHgO_2$ at ~500° C., which is low compared with the reaction temperature for the HBCCO compounds, and the easy reaction of the precursor with moisture and $CO_2$ in the air.

The unusual linear or dumb-bell coordination of Hg in HBCCO as demonstrated in $HgBa_2RCu_2O_{6.5+\delta}$ where R=rare earth and Hg-1201 show that there should exist a large number of vacant oxygen-sites in the Hg-layer. An even higher $T_c$ may be found in the HBCCO system by finetuning the doping levels, especially the anion doping. To carry out effectively the study, one needs samples of pure or nearly-pure phases of Hg-12(n-1)n. Unfortunately, the complexity of HBCCO compound chemistry and the toxicity of the Hg-containing ingredient make such a task extremely difficult.

SUMMARY OF THE INVENTION

The present invention involves a simple and safe route for the synthesis of high quality samples of Hg-12(n-1)n. For this invention, it has been found that: (1) the formation of Hg-12(n-1)n at ambient pressure undergoes a Hg-vapor/solid reaction process rather than a HgO-solid/solid diffusion that is similar to the solid-state reaction used for other-cuprate oxides; (2) there is competition between the formations of $CaHgO_2$ and Hg-12(n-1)n; (3) the formation of Hg-12(n-1)n depends critically on the precursor used and the synthesis conditions such as the Hg-vapor pressure, the reaction temperature, the reaction time, and the reaction atmosphere; and (4)the Hg-12(n-1)n is only marginally stable at temperatures close to although lower than the formation temperature.

It only recently became possible to synthesize samples with more than 90% Hg-1212 and Hg-1223 by volume, using the proper precursor and controlling the synthesis conditions, such as the reaction atmosphere, the Hg-vapor pressure, and the reaction temperature. it was this modified solid-state reaction technique that was used to prepare the Hg-1212 thin films in the present invention.

Some parameters that affect the formation of Hg12(n-1)n were examined. Based on this information, a controlled vapor/solid reaction CVSR technique has been developed and used to synthesize samples with up to 80–90% of Hg-1212 and 65–75% of Hg-1223 by volume with sharp superconducting transitions at ~120 K for Hg-1212 and ~135 K for Hg-1223, after annealing in flowing oxygen at 300° C.

The present invention is also for a process for synthesizing Hg-1212 films by reacting a precursor film in a controlled Hg-atmosphere. The films so-prepared exhibit a preferential orientation of the c-axis perpendicular to the (100) SrTiO3-substrate and a lattice parameter c=12.50 A, which is slightly smaller than that of the bulk Hg-1212 material. They all display a superconducting transition with the mid-point at ~110 to 120 K, similar to bulk Hg-1212.

By preparing the precursor carefully, controlling the reaction temperature and time, and adjusting the Hg-vapor pressure, the present invention of a controlled vapor/solid reaction process to synthesize samples with more than 90% Hg-1212 and Hg-1223 by volume in a simple and safe enclosed environment was developed. Samples so obtained display sharp superconducting transitions determined both magnetically and resistively. The magnetically-observed $T_c$'s of Hg-1212 and Hg-1223 are, respectively, ~111 K and 112 K as-synthesized but increase respectively to ~120 and ~135 K after oxygenation. The technique has also been successfully used to process highly-oriented Hg-1212 films. The process of the present invention may be equally usable for Hg-1201.

By reacting rf-sputtered thin-films of the precursor $Ba_2CaCu_2O_x$ (which is not a compound) on $SrTiO_3$ substrates in a controlled Hg-atmosphere, Hg-1212 thin-films have been successfully prepared by use of the process of the present invention. These films show a rather sharp superconducting transition determined magnetically at a temperature up to ~120 K, which is similar to that of bulk Hg-1212. They grow epitaxially with the c-axis preferentially oriented perpendicular to the surface of the substrate.

DETAILED DESCRIPTION OF THE PREFERRED EMBODIMENT

Figure 1:
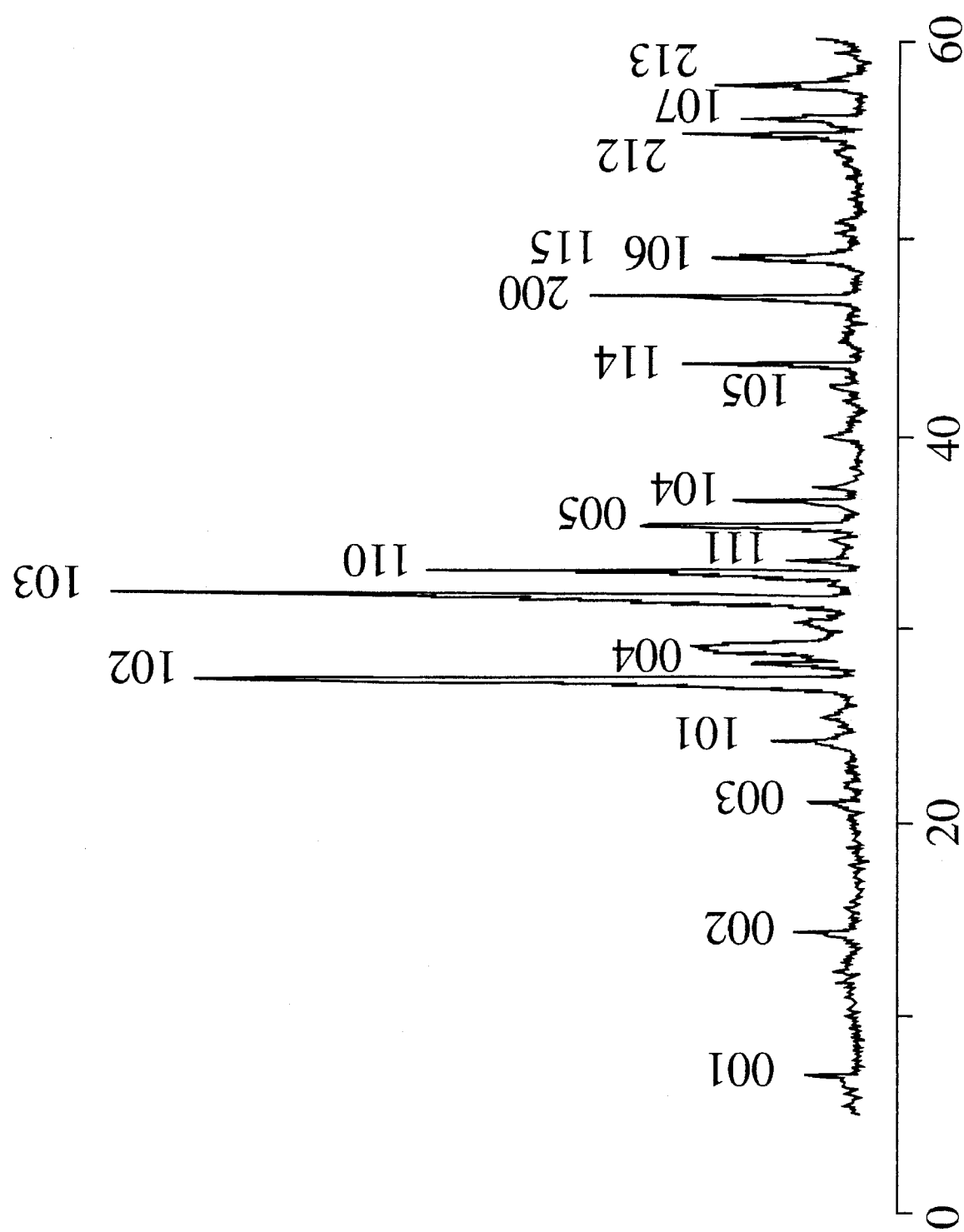
FIG. 1 graphically depicts an x-ray diffraction pattern of sample PH-60 with Hg-1212 as the major phase.

I. BULK SEMICONDUCTOR MATERIAL SYNTHESIS.

The controlled vapor/solid reaction (CVSR) process of the present invention for the synthesis of Hg-12(n−1)n basically consists of four main steps: (1) preparation of the precursor; (2) control of the Hg-vapor release and its pressure; (3) formation of Hg-12(n−1)n with n=2 and 3; and (4) oxygenation of Hg-12(n−1)n.

1. Preparation of the Precursor ($Ba_2Ca_{n-1}Cu_nO_x$).

The precursor $Ba_2Ca_{n-1}Cu_nO_x$ is usually a mixture of binary and tertiary oxides and therefore not a compound, except for n=1, which is difficult to synthesize as a single phase. Therefore, it can readily absorb moisture, react with $CO_2$ in air and form carbonates and/or hydroxides of the cations. Reacting such a contaminated precursor with HgO in a closed environment, such as a sealed quartz ampoule, may result in a rupture of the sealed quartz ampoule (perhaps due to the released. $H_2O$ and/or $CO_2$) or in the absence of Hg-12(n−1)n (perhaps due to the difficult formation of the compounds from the stable carbonates and/or hydroxides). In fact, both types of failure to produce Hg-12(n−1)n were observed in controlled experiments with aged precursors, while fresh precursors invariably venerate Hg12(n−1)n under the synthesis conditions to be described later. Therefore, preparation (especially the final step) of the precursor in an Ar- or $N_2$-atmosphere in a dry-box or a simple glove-bag was performed to keep exposure of the precursor to air to a minimum. The prepared precursor pellets were either used immediate or immediately stored in a desiccator for future use.

Precursors with three different sets of starting materials with the appropriate cation-proportions of Ba:Ca:Cu=2:(n−1):n have been used. They are: (A) $BaCO_3$ (Alfa, 99.997%), CaO (Alfa, 99.95%), and CuO(Cerac 99.999%); (B) $BaO_2$ (Atomergic Chemicals Corp., 99%), CaO (Alfa, 99.95%) and CuO (Cerac, 99.999%); and (C) $Ba(NO_3)_2$ (Alfa, 99.95%), $Ca(NO_3)_2 \cdot 4H_2O$ (Alfa, 99.995%), and $Cu(NO_3)_2 \cdot 3H_2O$ (Alfa, 99.9%). Hg-12(n−1)n has been made successfully with each of the three different sets of starting materials. However, the success rate increases with starting materials in the order of (A), (B) and (C). The difference may be related to the possible incomplete decomposition of the carbonate in (A) and the possible inhomogeneous mixing in (A) and (B).

When the (A)-set of starting materials was used, $BaCO_3$, CaO, and CuO were mixed in an agate mortar, compressed. into pellets of 1.3cmφx0.5cm thick, and then heated in an oxygen atmosphere for 24 to 48 hours at 900° C. to decompose $BaCO_3$ to BaO and $CO_2$ and to rid them of possible $H_2O$ and/or $CO_2$ contaminants. Sometimes, the steps were repeated two or three times to promote homogeneity. Compression was used to reduce the surface-to-volume ratio of the precursor to help reduce its degradation due to the inevitable exposure to air between some synthesis steps.

When the (B)-set of starting materials of $BaO_2$, CaO and CuO was used, preparation steps similar to those for the (A)-set of materials were adopted. The (C)-set of starting materials gave the highest success rate, perhaps due to better mixing at the molecular level of these ingredients. Appropriate amounts of $Ba(NO_3)_2$, $Ca(NO_3)_2 \cdot 4H_2O$ and $Cu(NO_3)_2 \cdot 3H_2O$ were all dissolved in deionized water inside a beaker. The solution was heated on a hot plate and stirred constantly with a magnetic stirrer. The solution was slowly dried into a blue powder in the beaker with the release of brown fumes of $NO_2$.

The blue powder, which melts at ~540° C. and boils at ~629° C., was then scraped out of the beaker, ground, then placed in an alumina crucible and slowly dried by heating it up to 500° to 550° C. and maintaining this temperature for one-half hour. It was then further heated up to 600° to 620° C. and kept at this temperature for approximately 1 hour until all nitrate gas was driven off. The resulting black mixture was then ground, compacted, and sintered in flowing oxygen at 900° C. for 24 to 48 hours to prepare the precursor pellets.

2. Control of the Hg-Vapor Pressure

One of the crucial questions in the synthesis of Hg-12(n–1)n is whether the compounds form through a solid (HgO)/solid(precursor) diffusion or a vapor(Hg)/solid(precursor) reaction, although only solid-HgO and precursor materials are used. A very simple test was conducted by sealing a pre-reacted Hg-1212 pellet and a $Ba_2CaCu_2O_x$ precursor pellet together, heating the composite slowly to 800° C. and keeping it at this temperature for approximately 5 hours before slowly cooling to room temperature. It was found that a large volume-fraction of the $Ba_2CaCu_2O_x$ pellet was transformed into Hg-1212. The observation suggests that HgO in the pre-reacted Hg-1212 (and also Hg-1223) must have decomposed into Hg and $O_2$ and then combined with other ingredients to form compounds through vapor/solid reaction and not solid/solid diffusion prior to reaching the reaction temperature of ~800° C. This certainly is not a surprise, since HgO decomposes at 500° C.

Another test was performed where HgO and $Ba_2CaCu_2O_x$, without mixing, were sealed and reacted. A large amount of CaHgO2 was found with a trace of Hg-1212 at best. This demonstrates that the rapid release of Hg from HgO at ~500° C. will result in the formation of $CaHgO_2$ before the reaction to form Hg-1212 enabled at ~800° C. Indeed, this is consistent with the formation temperature of $CaHgO_2$ at 500° to 550° C. Therefore, after the above tests, if the release of Hg-vapor and the Hg-vapor pressure in the sealed quartz ampoule can be controlled where the reaction of the precursor with HgO takes place, Hg-12(n–1)n can be synthesized.

Based on this principle, several schemes have been contemplated by using a composite Hg-source which releases Hg slowly. Two such schemes characterized. Hg-1212, which has two CuO2-layers per unit cell, displays are: (a) Fixed volume/varying reactant (FV/VR) methpd; and (b) Fixed volume/varying precursor-to-reactant ratio (FV/VP-R) method, where reactant represents the pre-reacted Hg-12(n–1)n. Both are further discussed below.

The reactant pellet was made by compressing the thoroughly mixed powder of appropriate amounts of HgO and pulverized precursor. In both above-mentioned methods, the Hg-supply was provided by the composite source of a compacted HgO/precursor pellet which could be just a reactant pellet. It should be noted that a precursor with a composition of Ba/Ca/Cu different from 2/(n–1)/n can also be used in the composite Hg-source pellet. However, using the specific composition of 2/(n–1)/n for making the composite Hg-source often turns the composite source itself into the desired Hg-12(n–1)n.

SUMMARY OF THE INVENTION

(a) Fixed Volume/Varying Reactant (FV/VR) Method.

Since tests show that the HgO in the reactant will first decompose at 500° C. into Hg-vapor and $O_2$, one may seal reactant pellets of varying masses in evacuated quartz tubes of fixed volume or reactant pellets of fixed mass in evacuated quartz tubes of varying volume. For the simplicity of experiment, the former was adopted, fixed volume/varying reactant method.

(b) Fixed Volume/Varying Precursor-to-Reactant Ratio (FV/VP-R) Method.

Instead of varying the Hg-vapor pressure by using different amounts of the reactant described above, the Hg-pressure was controlled by sealing a precursor pellet with the reactant pellet inside the quartz tube and by varying the precursor-to-reactant mass ratio. The rationale for doing this is the hope to reduce the chance of formation of $CaHgO_2$ due to the close solid (HgO)/solid (precursor) contact in the reactant pellet. Indeed, using this method, the $CaHgO_2$ volume-fraction was reduced in comparison with the FV/VR method.

3. Formation of Hg-1212 and Hg-1223

Pellets of reactants (Scheme (a)) and reactants/precursors (Scheme (b)) sealed in evacuated quartz tubes of fixed volumes, which were, in turn, encapsulated in stainless steel tubes for precautionary measures, were reacted inside a tubular furnace by slowly heating them at a rate of ~160° C./hour to 800° to 860° C. and kept at this temperature for 5 hours before slowly cooling to room temperature. Results showed that Hg-1212 becomes unstable above ~820° C. but difficult to form below ~750° C., and Hg-1223 forms more easily above 840° C.

4. Oxygenation

Oxygenation was carried out in flowing oxygen at temperatures from 100° to 310° C. for 1 to 90 hours with a pronounced effect on $T_c$ but not on the structure. Hg-12(n–1)n degrades above 330° C.

5. Results

All samples, both as-synthesized and oxygenated, underwent a quick resistive and magnetic screening before careful characterization by dc magnetization (X), X-ray- and resistivity (ρ)-measurements was made. By using the CVSR method described above, samples were synthesized with up to 80 to 90% Hg-1212 and 65 to 75% Hg-1223 with a 100% yield. The phase-fractions of the various phases present were estimated by fitting their non-overlapping X-ray diffraction peaks with the standard patterns. Later, the neutron-diffraction data taken at NIST on the same Hg-1212 samples suggested that the Hg-12(n-1)n phase-fractions listed in Tables 1–3 may be underestimated by 10 to 20%. The volume fractions of the superconducting Hg-12(n–1)n were also estimated by the magnetization measurements. The latter method usually gives a greater value. The volume of the quartz ampoules used for all results shown below was 1.655 $cm^3$. The effect of the synthesis conditions on the formation of Hg-12(n–1)n are summarized below.

Table 1 summarizes the volume fractions of various phases in samples prepared by the FV/VR method for Hg-1212. The reaction temperature was between 780° and 810° C. for these samples. It is evident that, at the low Hg vapor-pressure associated with the low mass of the reactants, only Hg-1201 was found, together with large amounts of $CaHgO_2$ and Ba-Cu-O ($BaCuO_2$ and/or $Ba_2Cu_3O_{5.9}$). As the Hg vaporpressure increases, Hg-1212 increases to ~60% (sample Hg-75) at the expense of other phases. If it is assumed that all Hg in sample Hg-75 is released, the Hg-vapor pressure for sample Hg-75 would be ~49.6 bar at 800° C. The lattice parameters of Hg-1212 are a =3.862(1) Å and c=12.707(5) Å. No noticeable change in the phase-fraction of Hg-1212 or in its lattice parameters was detected after oxygenation at 300° C. for up to 40 hours. The $T_c$ of the as-synthesized Hg-1212 ranges from ~110° to 120 K and it shifts up to 120 to 125 K after oxygenation.

Figure 2:
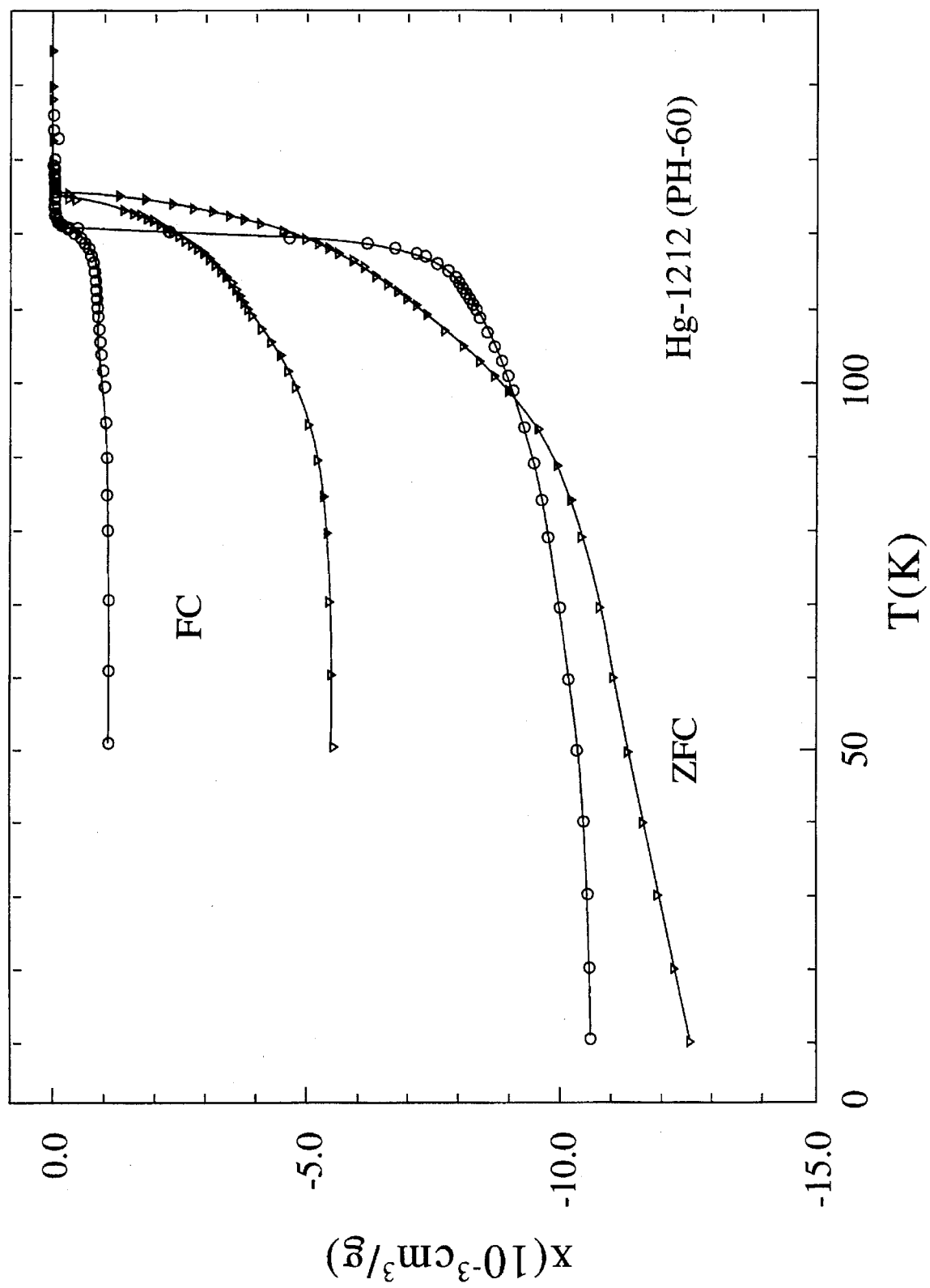
FIG. 2 graphically depicts χ vs. T Ph-60: O as-synthesized and ∇ post-oxygenated.
Figure 3:
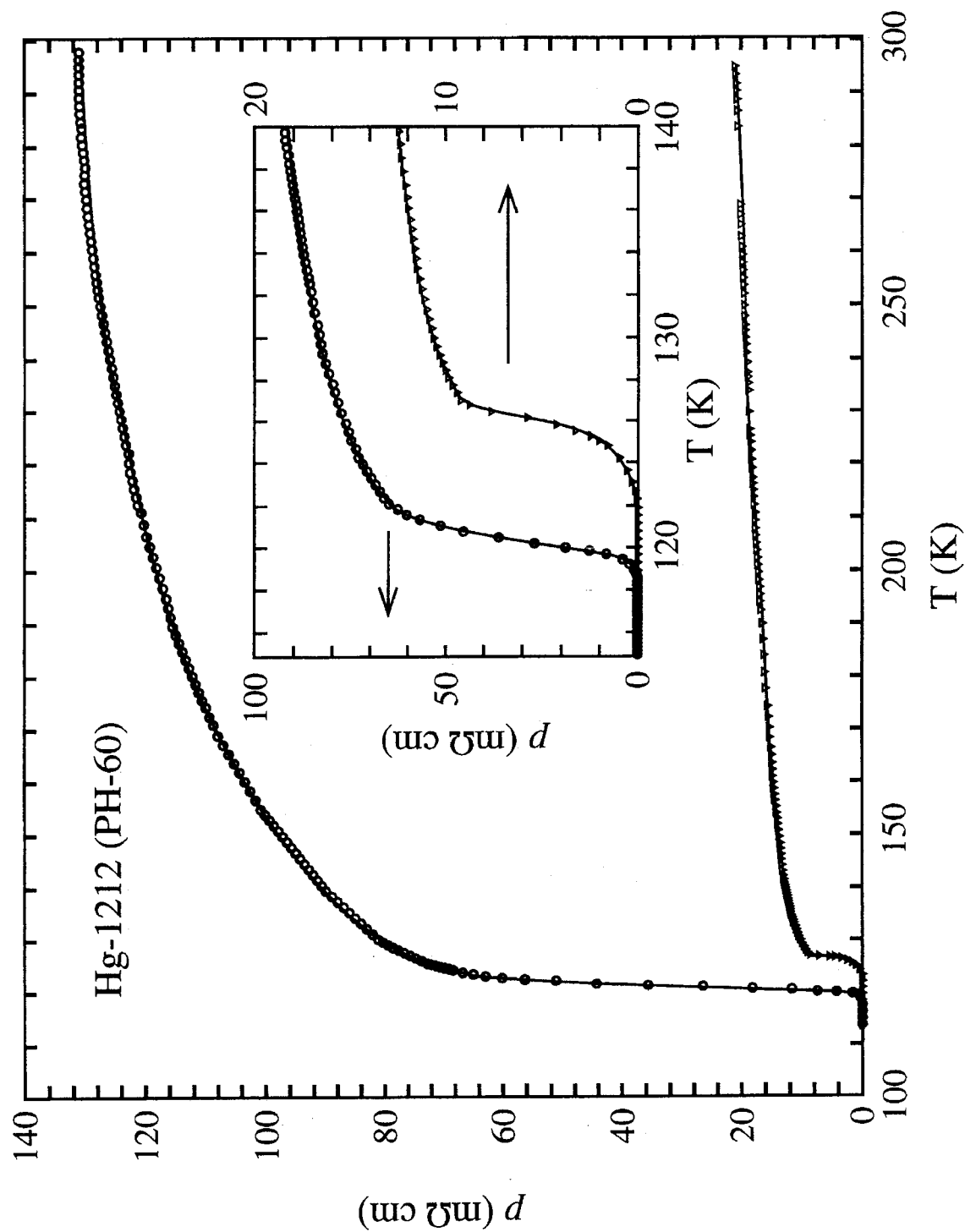
FIG. 3 graphically depicts P vs. T for Ph-60: O as-synthesized and ∇ post-oxygenated.

Table 2 summarizes the estimated volume-fractions of the various phases in representative samples prepared by the FV/VP-R method for Hg1212. The reactants and precursors used here were $HgBa_2CaCu_2O_x$ and $Ba_2CaCu_2O_x$, respectively. The reaction temperature was ~800° C. The mass of the reactant used is 1.75 gm which generated ~60% Hg-1212 by the FV/VR method. As a precursor of different masses was introduced to the ampoule, the equilibrium condition of reaction was changed, resulting in a change of the volume fractions of different phases. As the precursor mass increases, the volume fraction of Hg-1212 increased to ~75% and then decreased to ~70%, while $CaHgO_2$ continued to decrease, and Ba-Cu-O remained about the same except for PH-19 where Ba-Cu-O increased and HgO appeared. Often, but not always, the reactant and precursor pieces in the same run were found to be very similar in terms of the phase percentages. The X-ray diffraction pattern of PH-60 is shown in FIG. 1 and the magnetic susceptibility in FIG. 2 and resistivity in FIG. 3.

Figure 4:
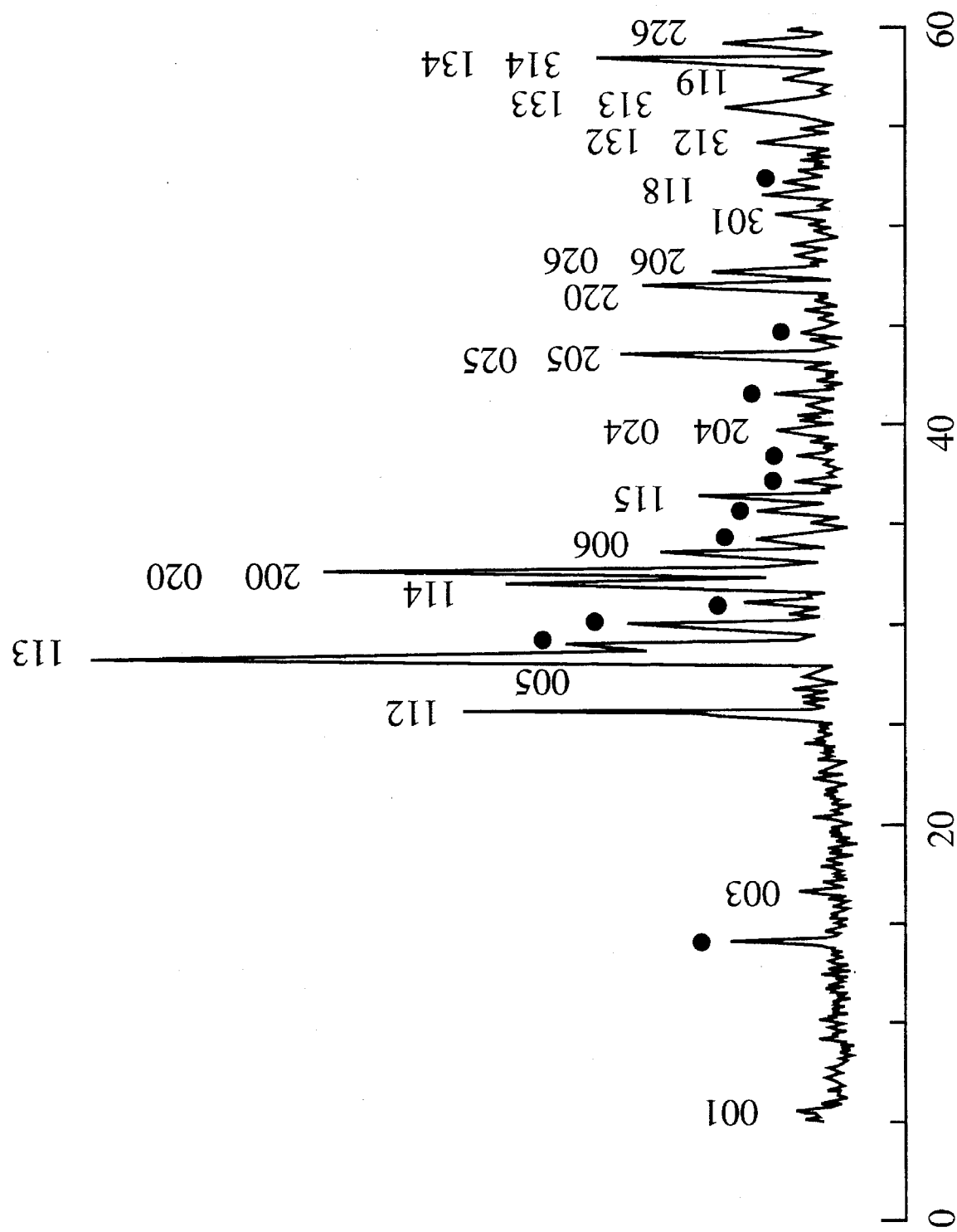
FIG. 4 graphically depicts a diffraction pattern of sample PI-45 with Hg-1223 as the major phase: • impurity peaks.
Figure 5:
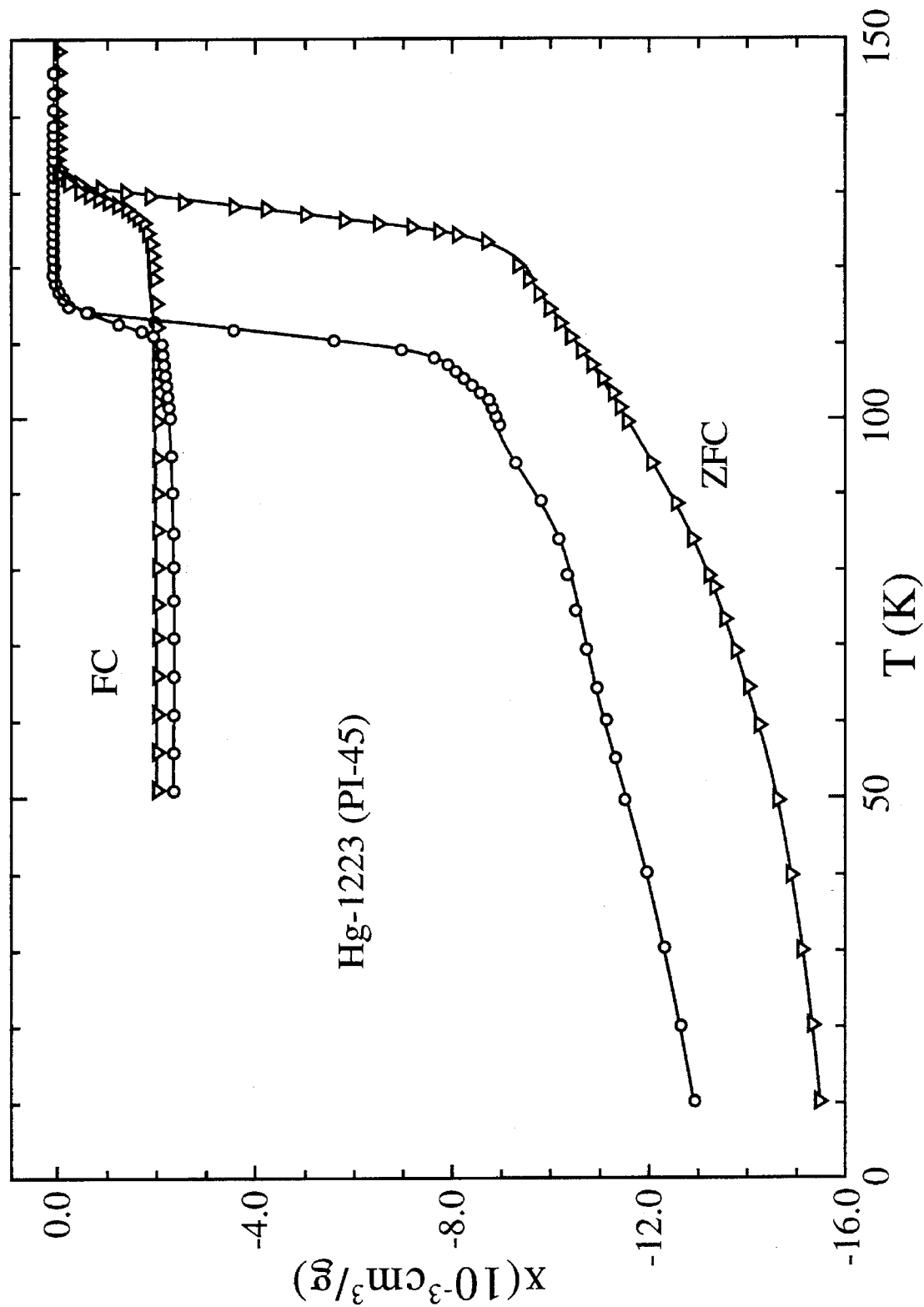
FIG. 5 graphically depicts χ vs. T for PI-45: • as-synthesized and ∇ post-oxygenated.
Figure 6:
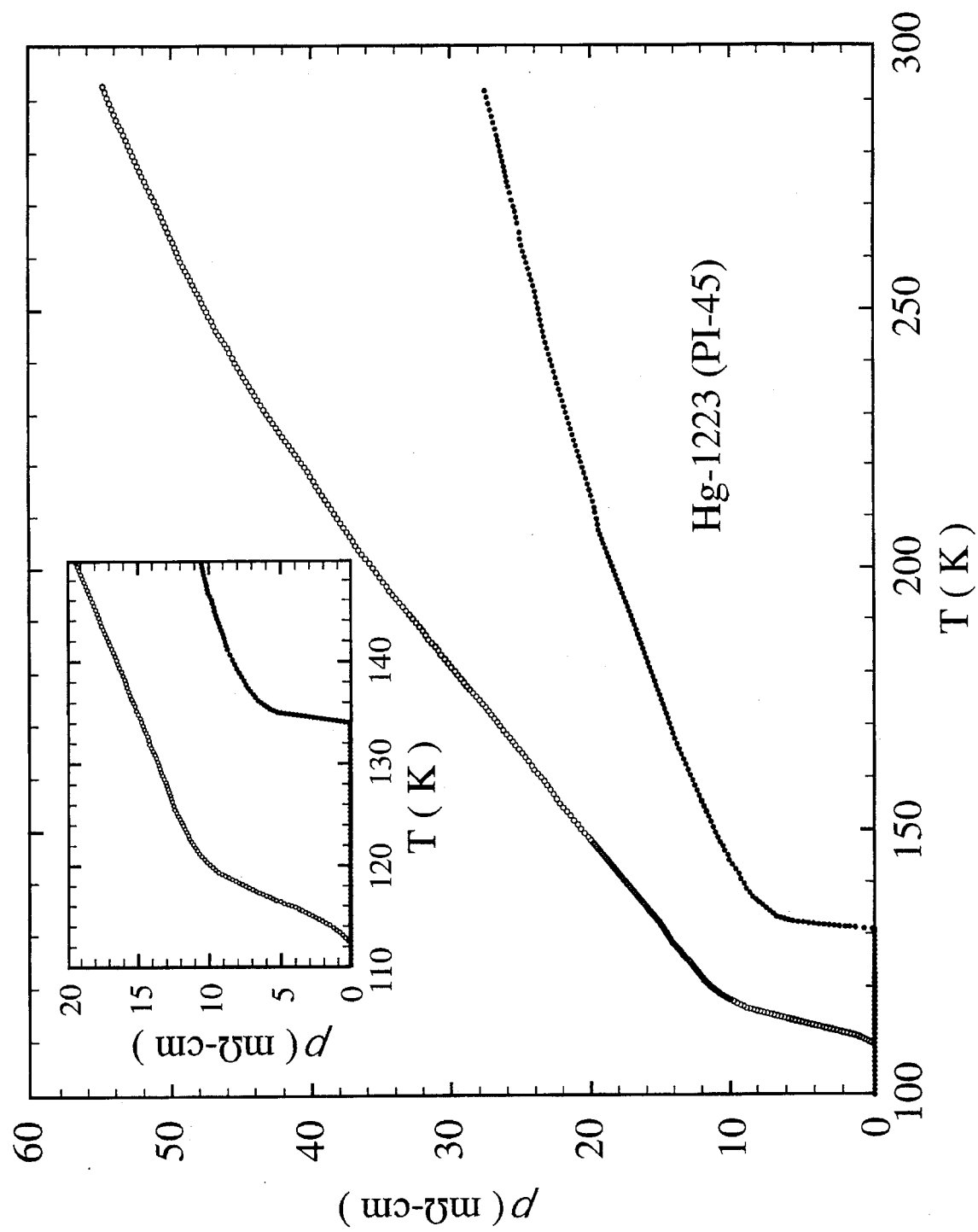
FIG. 6 graphically depicts P vs. T for PI-45: as-synthesized and • post-oxygenated. Enlarged p vs. T curve near $T_c$.

Table 3 summarizes the estimated volume-fractions of the various phases in representative samples prepared by the FV/VP-R method to obtain Hg-1223. The reactants and precursors used are $HgBa_2Ca_2Cu_3O_x$ and $Ba_2Ca_2Cu_3$, respectively. By concentrating on the precursor-to-reactant ratio close to ~0.4, which produced the best Hg-1212 samples, it was found that samples with large volume fraction of Hg-1223 can be obtained by increasing the reaction temperature ($T_R$) to ~860° C. for 5 hours. Apparently, longer reaction led to a deterioration of the sample, see Table 3. The obtained Hg-1223 was found to be orthorhombic with lattice parameters a=5.451(2) Å, b=5.432(2) Å, and c=15.826(7)Å and to have a sharp transition at ~112 K as-synthesized and as high as ~135 K after oxygenation for sample PI-45 (FIGS. 4 and 5). The resistivity becomes zero, or nearly zero, below 134 K (FIG. 6) for the same sample after oxygenation.

TABLE 1

Estimated phase-fractions in samples made by the FV/VR method.

| Sample Number | Reactant Mass (mg) | $T_c$* (K) | $\chi(\%)$† at 10 K | | X-ray (%)‡ | | | |
|---|---|---|---|---|---|---|---|---|
| | | | ZFC | FC | Hg-1212 | Hg-1201 | $CaHgO_2$ | Ba—CuO |
| Hg-89-91 | 148-310 | 70 | 6.2 | 5.7 | 0 | 30 | 40 | 30 |
| Hg-92-93 | 362-443 | 70 (110) | 6.2 | 5.8 | <10 | 40 | 25 | 25 |
| Hg-94 | 489 | 70 110 | 6.6 | 5.2 | 10 | 50 | 20 | 20 |
| Hg-95 | 540 | 110 (70) | 57 | 16 | 50 | 10 | 20 | 20 |
| Hg-75 | 690 | 120 | * | * | 60 | * | 25 | 15 |
| Hg-77 | 980 | 122 | * | * | 45 | * | 35 | 20 |
| Hg-65 | 1750 | 122 | * | * | 60 | * | 25 | 15 |

*the $T_c$ of the as-synthesized samples; in the case of 2-step superconducting transitions, the minority transition is indicated in parentheses; in the case of Hg-94, the two transitions were of comparable strengths
†the volume-fraction before correction for demagnetization; * indicates that no data was measured
‡the estimated volume-fraction; * indicates that no data was measured

TABLE 2

The estimated phase-fraction in samples by FV/VP-R method to obtain Hg-1212.

| Sample Number | P/R Ratio | $T_c$* (K) | $\chi(\%)$† at 10 K | | X-Ray (%)‡ | | | | |
|---|---|---|---|---|---|---|---|---|---|
| | | | ZFC | FC | Hg-1212 | Hg-1201 | $CaHgO_2$ | Ba—Cu—O | HgO |
| PH-65 | 0 | * | 70 | 9 | 60 | ~0 | 25 | 15 | ~0 |
| PH-57 | 0.12 | * | 69 | 12 | 60 | ~0 | 25 | 15 | ~0 |
| PH-60 | 0.31 | 122 | 79 | 8 | 75 | ~0 | 10 | 15 | ~0 |
| PH-19 | 0.40 | * | 41 | 11 | 70 | ~0 | 5 | 20 | 5 |

*the $T_c$ of the as-synthesized samples; * indicates that no data was measured
†the volume-fraction before correction for demagnetization
‡the estimated volume-fraction

TABLE 3

The estimated phase-fractions in samples prepared by the FV/VP-R method to obtain Hg-1223

| Sample Number | P/R Ratio | $T_c$* (K) | $\chi(\%)$† at 10 K | | X-Ray (%)‡ | | | | $T_R$ (°C.) |
|---|---|---|---|---|---|---|---|---|---|
| | | | ZFC | FC | Hg-1223 | Hg-1212 | $CaHgO_2$ | Ba—Cu—O | |
| PI-26 | 0.668 | * | * | * | 10 | 40 | 10 | 40 | 800 |
| PI-30 | 0.1867 | 134 | 168 | 12 | 20 | 40 | 20 | 20 | 840 |
| PI-34 | 0.398 | 134 | 95 | 17 | 55 | trace | 20 | 20 | 855 |

TABLE 3-continued

The estimated phase-fractions in samples prepared by the FV/VP-R method to obtain Hg-1223

| Sample Number | P/R Ratio | $T_c$* (K) | $\chi(\%)$† at 10 K | | X-Ray (%)‡ | | | | $T_R$ (°C.) |
|---|---|---|---|---|---|---|---|---|---|
| | | | ZFC | FC | Hg-1223 | Hg-1212 | CaHgO$_2$ | Ba—Cu—O | |
| PI-38§ | 0.406 | 130 | 43 | 6 | 10 | 30 | 20 | 40 | 855 |
| PI-45 | 0.390 | 134 | 117 | 15 | 65 | trace | 20 | 15 | 860 |

*the Tc of the sample after oxygenation
†the volume-fraction before correction for demagnetization
‡the estimated weight fraction
§10 hrs reaction time and 5 hrs for the others

II. THIN FILM SUPERCONDUCTOR MATERIAL SYNTHESIS

The preparation of Hg-1212 thin films involves four main steps, which will be described below. They are: (1) the preparation of the sputtering target; (2) the sputtering of the thin-film precursor; (3) the formation of Hg-1212 through gas/solid diffusion; and (4) the characterization of the Hg-1212 thin-films.

1. Sputtering Target

Carbon contamination was found to be detrimental to the formation of Hg-1212. Therefore, precautions were taken to avoid such contamination by using cation oxides or their equivalents instead of carbonates (even though carbonates work occasionally) as the starting ingredients and by carrying out all mixing in a glove box or glove bag in flowing argon. Since the sputtering and re-sputtering rates depend on the cation-species, preliminary results indicate that targets with the nominal composition of Ba/Ca/Cu =2/1.2/2.1 appear to give the composition closest to the desired Ba/Ca/Cu -2/1/2 for the thin-film precursor sputtered under conditions to be described in Step 2 below.

Each of the starting oxides of BaO$_2$, CaO, and CuO was first heat-treated in an oxygen atmosphere at between 880° and 900° C. for 48 hours to rid them of possible water vapor and/or carbonate contaminants. The heat-treated oxides were then pulverized and thoroughly mixed in the proportions cited above. The mixed powder was compressed at a pressure of ~2 kbar into disks of dimension 5.1 cm$\phi \times$0.5 cm. The sputtering target was obtained by firing in air the compacted disk in a box furnace at a rate of ~50° C./hour from room temperature to between 900° and 920° C. and maintained at that temperature for 20 to 24 hours, then slowly cooled at ~50° C./hour to room temperature. The slow cooling and heating were crucial to avoid cracking the target. The target was immediately transferred to a desiccator for storage before use.

2. Thin Film Precursor

Figure 7A:
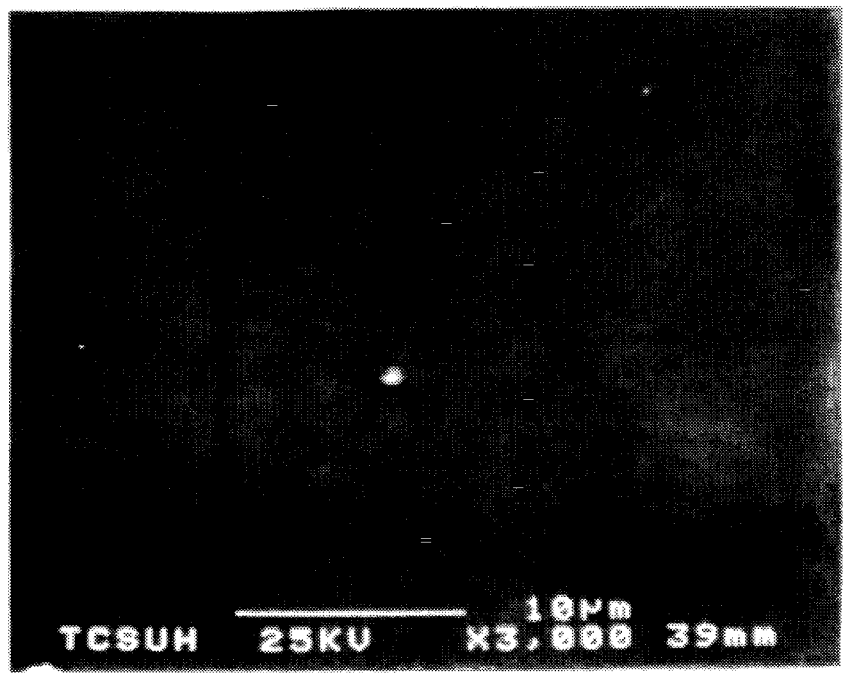
FIGS. 7a and 7b are the scanning electron micrograms of thin films of: (a) $Ba_2Ca_{1.12}Ba_{2.1}O_x$ and (b) Hg-1212.
Figure 8A:
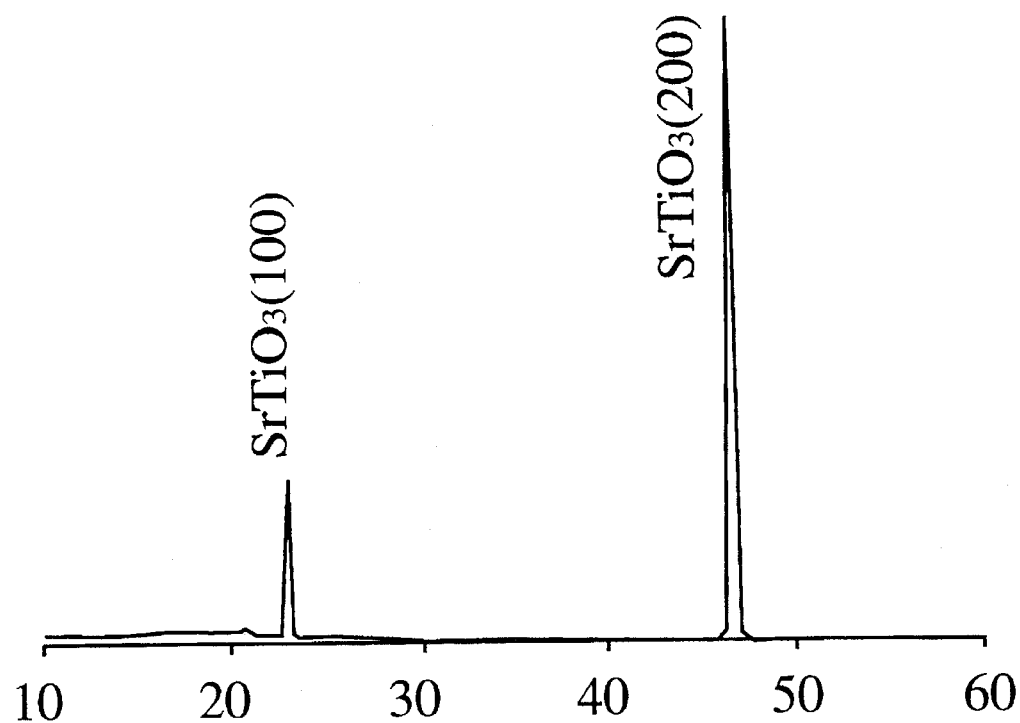
FIGS. 8a and 8b are the x-ray diffraction patterns of thin-films of: (a) $Ba_2Ca_{1.12}Ba_{2.1}O_x$, and (b) Hg-1212.

The Ba/Ca/Cu thin-film precursor was made by rf-magnetron sputtering on to (100) SrTiO$_3$-single crystalline substrates. During the sputtering, the incident power level was kept at 70 W while the reflected power was maintained at less than 2 W. The background pressure of the sputtering chamber was between $10^{-7}$ and $10^{-6}$ torr. A 4:1 mixture of Ar and O$_2$ gases was used as the sputtering atmosphere which was maintained at a pressure of 80 mtorr during sputtering at flow rates of 32 and 8 sccm, respectively. A thin-film precursor of ~1 μm thickness was therefore obtained. These films exhibit a very smooth surface, as shown in FIG. 7a by scanning electron microgram. No X-ray diffraction peaks characteristic of the film precursor are detected, as shown in FIG. 8a. Microprobe analysis showed the composition of the films to be Ba$_2$Ca$_{1.12}$Cu$_{2.1}$O$_x$. The thin-film precursor was stored in a desiccator immediately after preparation and before treating it in a Hg-atmosphere.

3. The Formation of Hg-1212 Films

The direct reaction of the thin-film precursor with HgO in a sealed quartz tube failed to produce a Hg-1212 film due to, the difficulty in controlling the Hg vapor-pressure. The Hg, released through the decomposition of HgO at ~500° C. reacted with the CaO-component readily to form CaHgO$_2$, before the formation of Hg-1212 at ~800° C. The same technique used to control the Hg-vapor pressure in the synthesis of bulk Hg-1212 and Hg-1223 was used to prepare the Hg-1212 films. Basically, the release of Hg was slowed by using a pre-reacted pellet of HgBa$_2$CaCu$_2$O$_x$ (instead of HgO) as the Hg-source and adjusting the Hg-vapor pressure by inserting a pellet of Ba$_2$CaCu$_2$O$_x$ of appropriate amount, e.g. in a ratio of HgBa$_2$CaCu$_2$O$_x$/Ba$_2$CaCu$_2$O$_x$=3 to 10.

The above composite Hg-source of HgBa$_2$CaCu$_2$O$_x$/Ba$_2$CaCu$_2$O$_x$ was then encapsulated together with the thin-film precursor of Ba$_2$CaCu$_2$O$_x$ in an evacuated quartz tube which was in turn sealed inside a stainless steel tube as a safety precaution. The whole assembly was slowly heated at a rate of ~160° C./hour to 800° C. and maintained at that temperature for 5 hours before being cooled to room temperature. Some of the samples were then annealed in flowing oxygen at 300° C. for 3 hours. Unlike the bulk, oxygenation seems not to generate too large an effect on the superconducting transition of the Hg-1212 films.

4. Characterization of Hg-1212

Figure 7B:
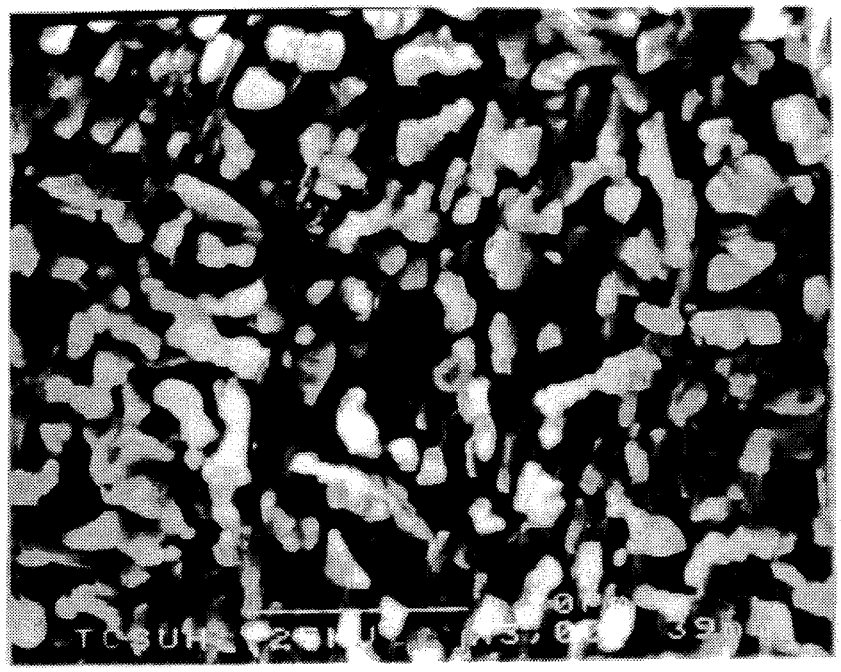

The Hg-1212 films have been characterized by X-ray diffraction, scanning electron microscopy, electron microprobe analysis, and magnetization measurements. After the reaction of the BaCaCu-precursor film in a controlled Hg-atmosphere, a change of the film surface morphology was clearly evident and a column-like structure appeared as shown in FIG. 7b. Three distinct phases in the over-layer were recognized in back-scattered electron images of these thin-film samples. Electron microprobe analysis and back-scattered imaging indicate that Hg-1212 was the most abundant phase present in the film.

Figure 8B:
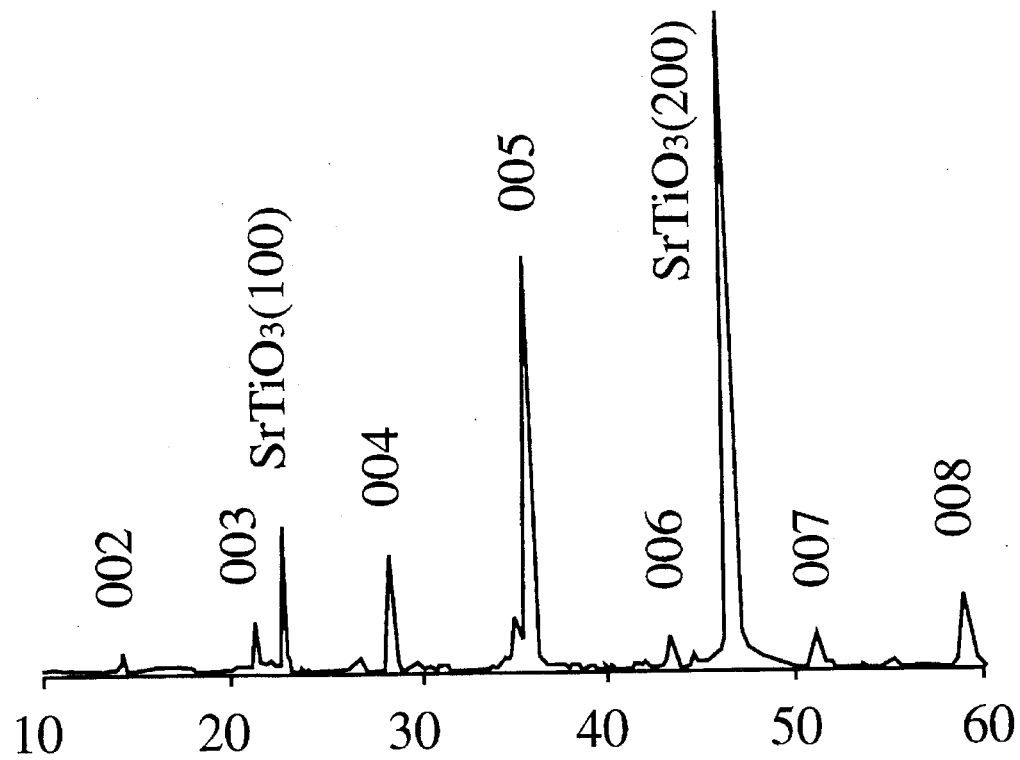

A minor Hg-bearing phase with the composition of ~Hg$_2$BaCu$_3$O$_x$ (not necessarily a compound) perched on top of the Hg-1212 phase. A second minor phase present was an oxide of Ba, Ca and Cu. It should be noted that, due to the irregular surface of the film and the small grain-sizes of the minor phases, chemical analysis was difficult. However, due to the epitaxy nature of the Hg-1212 films, the (00l) diffraction peaks were easily observed as shown in FIG. 8b. Ac=12.50 Å was thus obtained.

This is slightly smaller than the value of 12.70 Å obtained for bulk Hg-1212. The observation is similar to those on other HTS's, where the c-axes are often smaller in the thin-film form than in the bulk.

Figure 9:
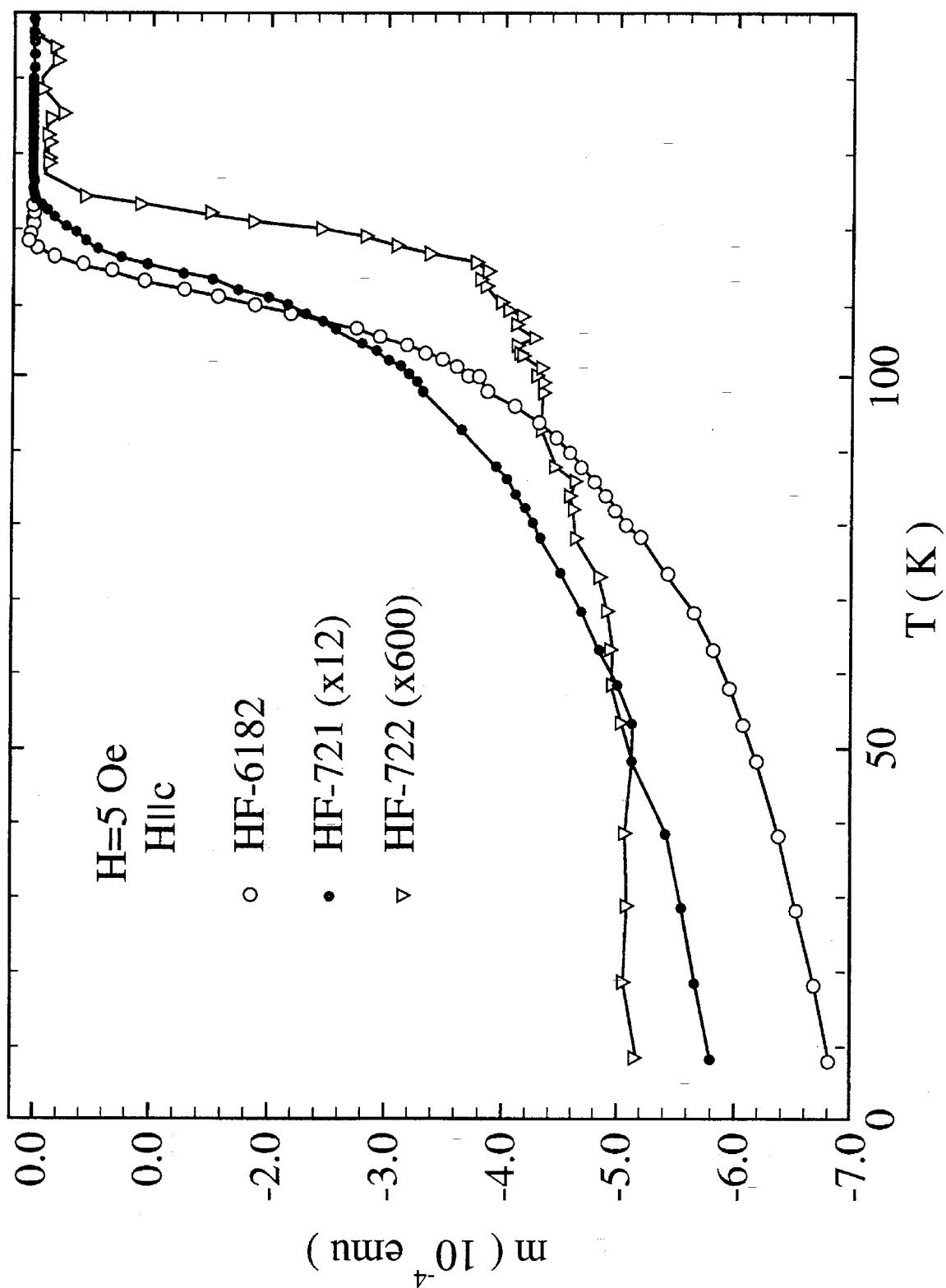
FIG. 9 graphically depicts the X(T) of several Hg-1212 thin films. H=5Oe; Hllc; oHF-6182; •HF-721 (x12);∇HF-722(x60).

The dc magnetization M was measured on several of these films. They all show a superconducting transition with the mid-point $T_c$ varying from ~110 to 120 K when measured at the zero field-cooled mode, as depicted in FIG. 9. Using the film sizes of ~2.4 mm ×~mm×1 μm, the estimated superconducting volume fraction of the films was ~3 to 96%. Unfortunately, the magnetization signal is rather small in the field-cooled mode, due to either the strong flux-pinning or a poor electrical connectivity of the film. The latter is consistent with a preliminary resistivity check that the film did not support a $J_c$ flowing through the whole sample.

Figure 10:
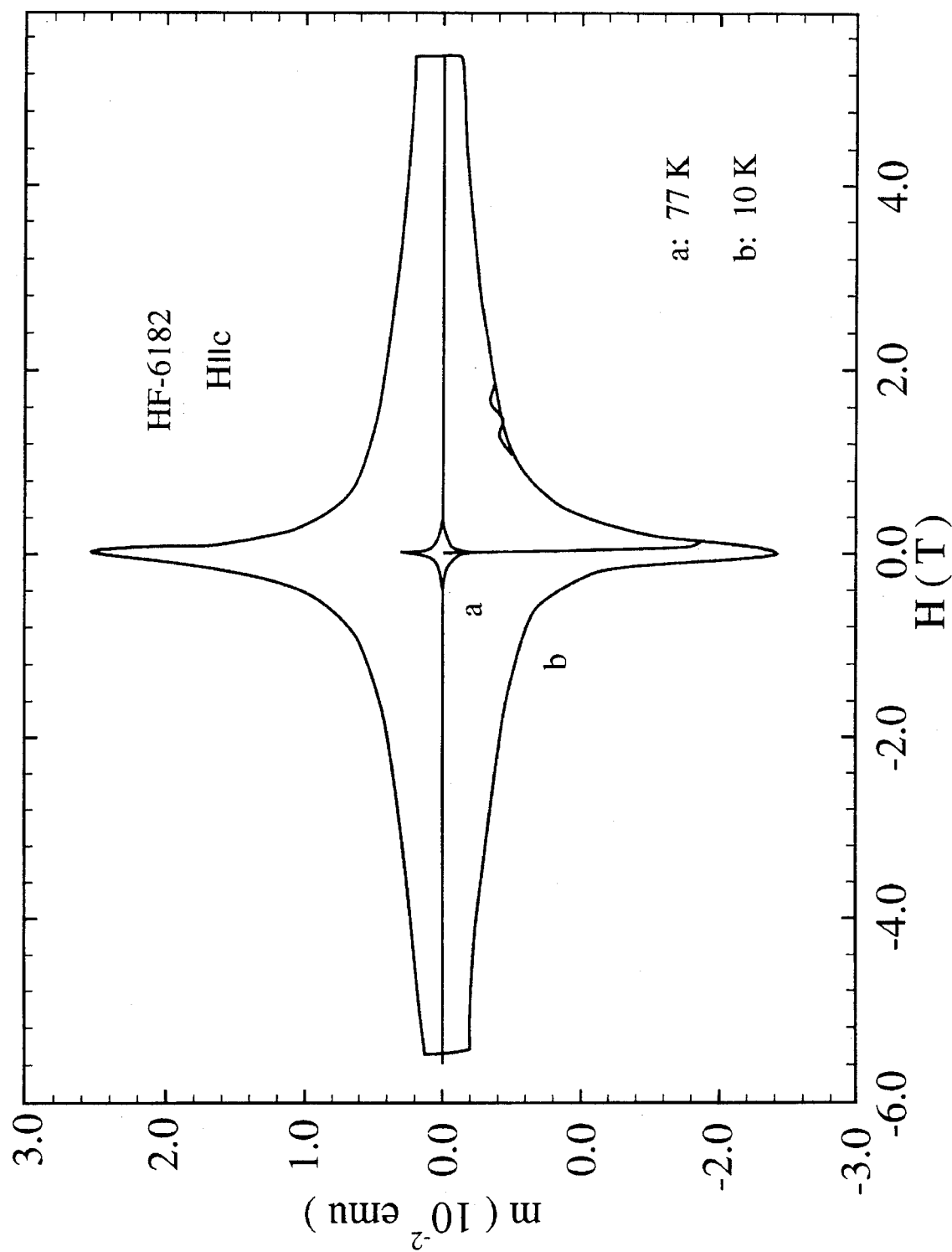
FIG. 10 graphically depicts the M-H loops of Hg-1212 thin films at 10 and 77 K.-HF-6182; Hllc; A:77K;B: 10K.

The M-H loop was also determined for the Hg-1212 thin film samples at both 77 and 10 K as shown in FIG. 10. A $J_c$ ~A/cm$^2$ at 10 K was obtained according to the Bean Model for the films so-prepared if a grain size of 100 μm as suggested by the scanning electron micrograph was used for the Hg-1212 in the films.

The foregoing disclosure and description of the invention are illustrative and explanatory of the preferred embodiments, and changes in the size, shape, materials and individual components circuit elements, connections and construction may be made without departing from the spirit of the invention.

What is claimed is:

1. A method of synthesizing a high temperature superconductor composition, comprising the steps of:
   (a) preparing a precursor consisting essentially of $Ba_2Ca_{n-1}Cu_nO_x$, where n=2 or 3, and x=2n+1, by mixing starting materials having cation-proportions of Ba:CaO:Cu equal to about 2:(n−1):n; compressing said mixture; and then heating said compressed mixture in an oxygen atmosphere to about 840°–900° C.;
   (b) sealing precursor pellets together with pellets of a composite Hg-source reactant having a mass ratio between about 0 and 0.4 in an evacuated container having a fixed volume;
   (c) heating said precursor and composite Hg-source pellets to about 750° to 860° C. for about five hours and controlling vapor pressure in said container by slowly releasing Hg such that a reaction of said precursor with HgO takes place and CaHgO$_2$ formation is substantially limited so as to form HgBa$_2$Ca$_{n-1}$Cu$_n$O$_{2n+2+\delta}$ (Hg-12(n−1)n), where n=2 or 3 and δ is the oxygen surplus; and
   (d) oxygenating said formed Hg-12(n−1)n in flowing oxygen at about 100° to 330° C. for about 1 to 90 hours.

2. The method of claim 1, wherein said step of preparing a precursor utilizes starting materials which consist essentially of BaCO$_3$, CaO and CuO.

3. The method of claim 1, wherein said step of forming a precursor is accomplished by heating said compressed mixture to about 900° C. for about 24 to 48 hours so that BaCO$_3$ is substantially decomposed into BaO and CO$_2$ and concentrations of H$_2$O and CO$_2$ are substantially reduced.

4. The method of claim 1, wherein said step of compressing said mixture is accomplished so that pellets are formed about 1.3 cm φ×0.5 cm thick.

5. The method of claim 1, wherein said step of heating said compressed mixture is accomplished by heating said mixture for about 24 to 48 hours.

6. The method of claim 5, wherein said step of heating said compressed mixture is accomplished at about 900° C.

7. The method of claim 1, wherein said step of preparing said Ba$_2$Ca$_{n-1}$Cu$_n$O$_x$ precursor is accomplished by the steps of:
   (a) mixing said starting materials which consist essentially of BaO$_2$, CaO and CuO;
   (b) compressing said mixture; and
   (c) heating said compressed mixture in an oxygen atmosphere.

8. The method of claim 7, wherein said step of compressing said mixture is accomplished so that pellets are formed about 1.3 cm φ×0.5 cm thick.

9. The method of claim 7, wherein said step of heating said compressed mixture is accomplished by heating said mixture for about 24 to 48 hours.

10. The method of claim 9, wherein said step of heating said compressed mixture is accomplished at about 900° C.

11. The method of claim 7, wherein said step of heating said compressed mixture is accomplished in an oxygen atmosphere for about 24 to 48 hours at 900° C. so that said BaCO$_3$ is substantially decomposed into BaO and CO$_2$ and concentrations of H$_2$O and CO$_2$ are substantially reduced.

12. The method of claim 1, wherein said step of preparing said Ba$_2$Ca$_{n-1}$Cu$_n$O$_x$ precursor is accomplished by the steps of:
   (a) dissolving said starting materials which consist essentially of Ba(NO$_3$)$_2$, Ca(NO$_3$)$_2$.4H$_2$O and Cu(NO$_3$)$_2$.3H$_2$O in a solvent;
   (b) heating said solution;
   (c) stirring said solution;
   (d) drying said solution so that essentially all nitrate gas is driven off and a black mixture is formed;
   (e) compacting said black mixture; and
   (f) sintering said compacted mixture.

13. The method of claim 12, wherein said solvent is deionized water.

14. The method of claim 12, wherein said step of drying said solution is accomplished by the step of:
   (a) drying said solution so that a blue power is formed;
   (b) drying said blue powder by heating it to about 500° to 550° C. for about one-half hour; and
   (c) heating said blue powder further to at least 600° to 620° C. for about one hour so that essentially all nitrate gas is driven off.

15. The method of claim 12, wherein said step of sintering said compacted mixture is accomplished in flowing oxygen at about 900° C. for about 24 to 48 hours.

16. The method of claim 12, wherein said step of compacting said black mixture is accomplished by grounding and compacting said mixture.

17. The method of claim 1, further comprising the steps of:
   (a) using a pure Hg-source as a source of said Hg-vapor; and
   (b) connecting an evacuated container having one or more precursor pellets contained therein to said pure Hg-source.

18. The method of claim 1, wherein said step of preparing said precursor further comprises:
   (a) pulverizing said precursor;

(b) mixing HgO and said pulverized precursor to form a mixture; and (c) compressing said mixture.

19. The method of claim 18, wherein said pulverized precursor has a composition of Ba/Ca/Cu equal to about $2/(n-1)/n$.

20. The method of claim 1, wherein said one or more pellets of reactant and precursor are heated to about 750° to 860° C. at a rate of about 160° C. per hour.

21. The method of claim 1, wherein Hg-12(n–1)n is $HgBa_2CaCu_2O_{6+\delta}$ and wherein said step of heating said one or more pellets is accomplished by heating said pellets to about 750° to 820° C.

22. The method of claim 1, wherein Hg-12(n–1)n is $HgBa_2Ca_2Cu_3O_{8+\delta}$ and wherein said step of heating said one or more precursor and reactant pellets is accomplished by heating said pellets to about 750° to 840° C.

23. The method of claim 1, wherein said step of oxygenating Hg-12(n–1)n is accomplished in flowing oxygen at about 100° to 330° C. for about 1 to 90 hours.

24. A method of synthesizing a high temperature superconductor composition, comprising the steps of:

(a) preparing a $Ba_2Ca_{n-1}Cu_nO_x$ precursor, where n=2 to 3 and x≅2n+1, by the following steps:
  (i) dissolving starting materials which consist essentially of $Ba(NO_3)_2$, $Ca(NO_3)_2 \cdot 4H_2O$ and $Cu(NO_3)_2 \cdot 3H_2O$ in a solvent;
  (ii) heating said solution to about 300° C.;
  (iii) agitating said solution;
  (iv) drying said solution at about 600°–650° C. so essentially all nitrate gas is driven off and a black mixture of $Ba_2Ca_{n-1}Cu_nO_x$ is formed;
  (v) compacting said black mixture; and
  (vi) sintering said compacted mixture at about 840°–900° C.;

(b) reacting said precursor with a composite Hg-source reactant, wherein vapor pressure is regulated in said container by slowly releasing Hg such that a reaction of said precursor with HgO takes place and $CaHgO_2$ formation is substantially limited so as to form $HgBa_2Ca_{n-1}Cu_nO_{3n+2+\delta}$ (Hg-12(n–1)n), where N=2 or 3 and $\delta$ is the oxygen surplus; and (c) oxygenating said formed Hg-12(n–1)n in flowing oxygen at about 100° to 300° C.

25. The method of claim 24, wherein said step of forming Hg-12(n–1)n is accomplished by sealing said composite Hg-source reactant in an evacuated container so that the formation of $CaHgO_2$ is substantially limited when said reactant is heated to more than about 500° C.

26. The method of claim 25, wherein said reactant is formed by compressing a mixture of HgO and a pulverized precursor consisting essentially of $Ba_2C_{n-1}Cu_nO_x$ with Ba/Ca/Cu equal to about $2/(n-1)/n$.

27. The method of claim 24, wherein said step of preparing said $Ba_2Ca_{n-1}Cu_nO_x$ precursor is accomplished by preparing the precursor in an argon atmosphere.

28. The method of claim 27, wherein said step of preparing said $Ba_2Ca_{n-1}Cu_nO_x$ precursor in an argon atmosphere is accomplished in a dry-box.

29. The method of claim 24, wherein said step of preparing said $Ba_2Ca_{n-1}Cu_nO_x$ precursor is accomplished in a nitrogen atmosphere.

30. The method of claim 29, wherein said step of preparing said $Ba_2Ca_{n-1}Cu_nO_x$ precursor in a nitrogen atmosphere is accomplished in a dry-box.

31. The method of claim 27, wherein said step of preparing said $Ba_2Ca_{n-1}Cu_nO_x$ precursor is accomplished in a glove-bag.

32. The method of claim 29, wherein said step of preparing said $Ba_2Ca_{n-1}Cu_nO_x$ precursor is accomplished in a glove-bag.

33. A method of synthesizing a high temperature superconductor composition, comprising the steps of:

(a) preparing a precursor consisting essentially of $Ba_2C_{n-1}Cu_nO_{x\delta}$, where n=2 or 3 and x≅2n+1, with Ba:CaO:Cu equal to about $2:(n-1):n$; and (b) sealing said $Ba_2C_{n-1}Cu_nO_x$ precursor and a composite Hg-source reactant in a container whereby the mass of said precursor and said reactant used is varied and a volume of the container is fixed and wherein vapor pressure in said container is controlled by slowly releasing Hg such that a reaction of said precursor with HgO takes place and formation of $CaHgO_2$ is substantially limited when said precursor and reactant are heated to more than about 500° C.; and (c) forming $HgBa_2Ca_{n-1}Cu_nO_{2n+2+\delta}$ (Hg-12(n–1)n, where n=2 or 3 and $\delta$ is the oxygen surplus.

* * * * *